United States Patent
Riedel et al.

(10) Patent No.: US 11,757,065 B2
(45) Date of Patent: Sep. 12, 2023

(54) LIGHT-EMITTING COMPONENT

(71) Applicant: OSRAM OLED GmbH, Regensburg (DE)

(72) Inventors: Daniel Riedel, Munich (DE); Andreas Rausch, Tegernheim (DE); Ulrich Niedermeier, Leiblfing (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/487,783

(22) Filed: Sep. 28, 2021

(65) Prior Publication Data

US 2022/0020899 A1 Jan. 20, 2022

Related U.S. Application Data

(63) Continuation of application No. 16/792,608, filed on Feb. 17, 2020, now Pat. No. 11,158,765, which is a continuation of application No. 15/549,626, filed as application No. PCT/EP2016/052898 on Feb. 11, 2016, now Pat. No. 10,608,143.

(30) Foreign Application Priority Data

Feb. 13, 2015 (DE) .......................... 102015102105.6

(51) Int. Cl.
*H01L 33/40* (2010.01)
*H10K 59/10* (2023.01)
*H10K 59/90* (2023.01)
*H01L 33/20* (2010.01)

(52) U.S. Cl.
CPC ............ *H01L 33/405* (2013.01); *H01L 33/20* (2013.01); *H10K 59/221* (2023.02); *H10K 59/90* (2023.02); *H01L 2933/0091* (2013.01)

(58) Field of Classification Search
CPC . B32B 2457/206; H01L 27/3237–3297; H01L 33/00–648; H01L 27/15–156; H01L 2933/00–0091; H01L 33/08; H01L 33/20–24; H01L 33/0054–0058; H01L 33/34–346; H01L 33/30–325; H01L 33/0062–0079; H01L 33/0025; H01L 33/002; H01L 51/50–56
See application file for complete search history.

(56) References Cited

U.S. PATENT DOCUMENTS

| 7,049,757 | B2 | 5/2006 | Foust et al. |
| 9,316,369 | B2 | 4/2016 | Sarrant-Foresti et al. |
| 9,553,133 | B2 | 1/2017 | Ingle |
| 2008/0224949 | A1 | 9/2008 | Lee et al. |

(Continued)

FOREIGN PATENT DOCUMENTS

| DE | 10324787 A1 | 2/2004 |
| DE | 102012109218 A1 | 4/2014 |

(Continued)

*Primary Examiner* — Julio J Maldonado
*Assistant Examiner* — Stanetta D Isaac
(74) *Attorney, Agent, or Firm* — Botos Churchill IP Law LLP

(57) ABSTRACT

A light-emitting component a first layer stack configured to generate light, at least one additional layer stack configured to generate light, where each of the first layer stack and the at least one additional layer stack are separately drivable from one another and where an auxiliary structure is arranged between the first layer stacks and the at least one additional layer stacks.

20 Claims, 2 Drawing Sheets

(56) References Cited

U.S. PATENT DOCUMENTS

| | | |
|---|---|---|
| 2015/0372062 A1 | 12/2015 | Ingle |
| 2016/0149162 A1 | 5/2016 | Diez et al. |
| 2016/0268353 A1 | 9/2016 | Sawabe et al. |
| 2017/0077206 A1 | 3/2017 | Regau et al. |

FOREIGN PATENT DOCUMENTS

| | | |
|---|---|---|
| DE | 102013104604 A1 | 11/2014 |
| DE | 102013106502 A1 | 12/2014 |
| DE | 102013106804 A1 | 12/2014 |
| DE | 102014102255 A1 | 8/2015 |
| EP | 1536470 A2 | 6/2005 |
| FR | 2987426 A1 | 8/2013 |
| WO | 2010100584 A2 | 9/2010 |

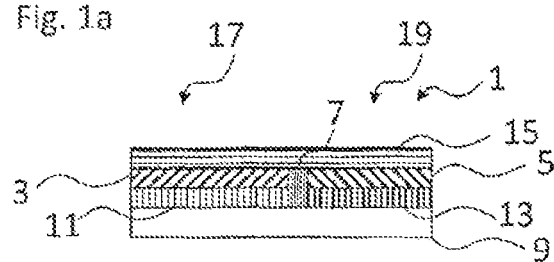
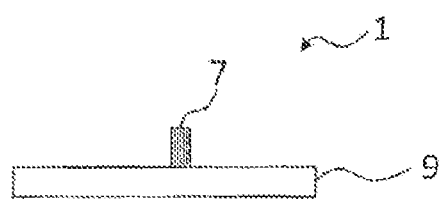
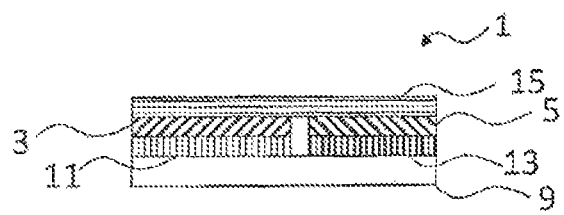
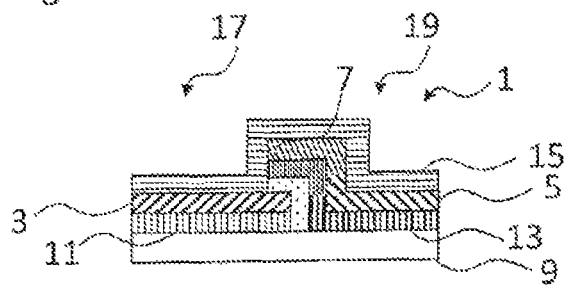

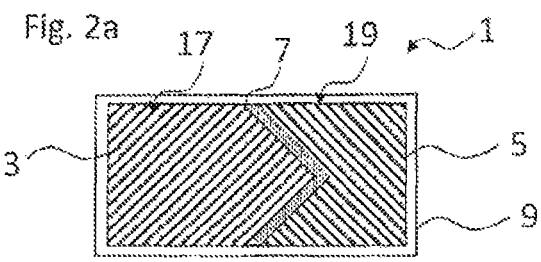
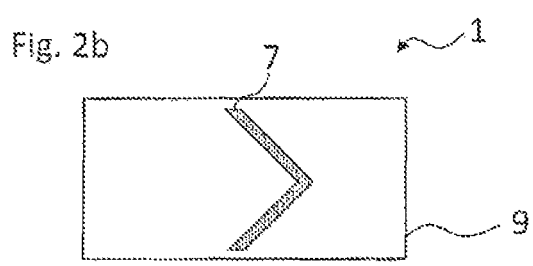
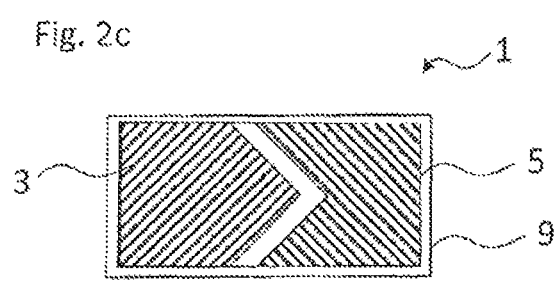
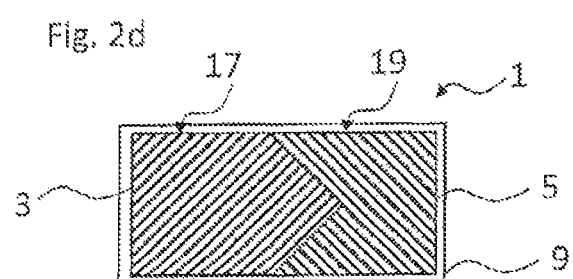

LIGHT-EMITTING COMPONENT

CROSS-REFERENCE TO RELATED APPLICATIONS

This application is a continuation of U.S. application Ser. No. 16/792,608, allowed filed on Feb. 17, 2020, which application is a continuation of U.S. application Ser. No. 15/549,626, filed on Aug. 8, 2017, now U.S. Pat. No. 10,608,143, issued on Mar. 31, 2020, which application is a national phase entry under 35 U.S.C. § 371 of International Application No. PCT/EP2016/052898 filed Feb. 11, 2016, published in Dutch, which claims priority from German patent application number 10 2015 102 105.6, filed Feb. 13, 2015, all of which are incorporated herein by reference.

BACKGROUND OF THE INVENTION

A light-emitting device is defined.

BRIEF SUMMARY OF THE INVENTION

In embodiments a light-emitting device is disclosed. The light emitting device includes a plurality of light-emitting segments having, for example, different brightness levels, colors or shapes can be implemented by providing the plurality of segments with separate electrodes that can be driven by different currents via separate supply lines. Making contact separately with the segments increases the production complexity compared with an unsegmented light-emitting device.

In further embodiments a light-emitting device has a plurality of segments that can be driven separately from one another, which device can be produced easily and allows efficient operation.

In other embodiments a light-emitting device is defined. The light-emitting device may be, for example, a light-emitting diode, in particular an organic light-emitting diode (OLED).

In yet other embodiments the light-emitting device extends in a vertical direction between a first main plane and a second main plane, where the vertical direction can run transverse or perpendicular to the first and/or second main plane. The main planes may be, for example, a top face and a bottom face of the light-emitting device. The light-emitting device has a planar design extending in the lateral direction, i.e., for instance extends, at least in places, parallel to the main planes, and in the vertical direction has a thickness that is small compared with a maximum extent of the light-emitting device in the lateral direction.

In at least one embodiment, the light-emitting device comprises a first layer stack for generating light. The first layer stack is designed to generate light during operation of the light-emitting device. The light generated in the first layer stack in this process can be white or colored light. In this context, the first layer stack comprises organic layers, for example. The light-emitting device may then be in particular an organic light-emitting diode, for example. Said first layer stack defines in particular an illuminable segment of the light-emitting device.

In at least one embodiment, the light-emitting device comprises at least one additional layer stack for generating light. The at least one additional layer stack is designed in particular like the first layer stack to generate light during operation of the light-emitting device. Light generated in this process in the at least one additional layer stack can be white or colored light in each case. In particular, a brightness and/or a color of light generated in the at least one additional layer stack can differ from the brightness and/or color of light generated in the first layer stack. In addition, a shape of a lateral extent of the at least one additional layer stack can differ from a shape of a lateral extent of the first layer stack, with the result that in particular differently shaped illuminable segments of the light-emitting device are formed by the layer stacks.

In at least one embodiment, the first and the at least one additional layer stacks can each be driven separately from one another. In this context, contact with the layer stacks is in particular made separately. In particular, the layer stacks are arranged such that they are not in contact with one another. A material of the layer stacks and/or a thickness of the layer stacks in the vertical direction can be designed to be different from one another, for instance.

In at least one embodiment, an auxiliary structure is arranged between layer stacks in each pair of adjacent layer stacks. In this regard, the auxiliary structure can be arranged, for example, in direct contact with the layer stacks of each pair of adjacent layer stacks. For instance, the auxiliary structure completely or at least partially fills a region between the layer stacks of each pair of adjacent layer stacks in the lateral direction. In particular without the auxiliary structure, said region between the layer stacks of each pair of adjacent layer stacks in the lateral direction may be, during operation of the light-emitting device, a visible separating area which, when the light-emitting device is viewed vertically from above, separates respective adjacent segments.

The auxiliary structure is preferably made of, or contains, a polyamide, acrylate or epoxide. The auxiliary structure can be designed to be an electrical insulator in this case, for example. In addition, the auxiliary structure can be designed to be translucent at least in places, for example. Moreover, the auxiliary structure can have a light-scattering design at least in places, for example.

In at least one embodiment, the light-emitting device comprises a first layer stack for generating light and at least one additional layer stack for generating light, each of which can be driven separately from one another. An auxiliary structure is arranged between layer stacks in each pair of adjacent layer stacks. Said auxiliary structure is arranged in particular such that light passes vertically through said structure, for example, at least in places, from one of the respective layer stacks, and/or such that said auxiliary structure couples out, at least in places, guided modes, and/or couples out, at least in places, light captured by total internal reflection in the light-emitting device.

A light-emitting device of this type advantageously allows laterally adjacent segments of the light-emitting device to appear connected and contiguous to a viewer when the light-emitting device is put to its intended use. This also has the advantage that a ratio of an un-illuminated area of the light-emitting device to an illuminated area of the light-emitting device can be minimized, thereby contributing in particular to efficient operation of the light-emitting device.

In at least one embodiment, a mean distance between the layer stacks in each pair of adjacent layer stacks equals between 50 µm and 500 µm inclusive, in particular between 100 µm and 200 µm inclusive. A gap of this size between adjacent layer stacks simplifies arranging the layer stacks laterally adjacent to one another without material from the one layer stack coming into contact with material from the other layer stack, i.e., with this relatively large value defined for the distances between the layer stacks, it is possible to drive the layer stacks independently. The auxiliary structure described here between the layer stacks can prevent the gap being visible for the viewer, giving the impression of layer stacks that transition seamlessly into one another.

In at least one embodiment, a mean lateral extent of the layer stacks equals between 1 mm and 100 mm inclusive. In particular, the mean lateral extent of the layer stacks is between a multiple of 5 and 2000 inclusive of the mean distance between the layer stacks in each pair of adjacent layer stacks.

In at least one embodiment, a first electrode is assigned to each of the first and the at least one additional layer stacks, which electrode makes electrical contact with the associated layer stack. In addition, a common second electrode is assigned to the first and the at least one additional layer stacks, which electrode makes electrical contact with the layer stacks. The electrodes are designed in particular to inject current into the respective layer stacks. One of the electrodes may here be a light-transmissive electrode, and an electrode that is arranged vertically opposite the light-transmissive electrode may be a reflective electrode.

In at least one embodiment, each of the first electrodes contains a transparent conductive oxide (TCO). Transparent conductive oxides are transparent conductive materials, normally metal oxides such as, for instance, zinc oxide, tin oxide, aluminum tin oxide, cadmium oxide, titanium oxide, indium oxide or indium tin oxide (ITO). Each of said first electrodes is preferably arranged in direct contact with the associated layer stack on a surface of the associated layer stack that faces the bottom face of the light-emitting device.

In at least one embodiment, the second electrode is designed to be reflective. This advantageously contributes to a high light output from the light-emitting device. In this context, the second electrode can be made of, or contain, a metal having a high reflectivity, for instance a metal such as aluminum or silver.

In at least one embodiment, the first layer stack and the at least one additional layer stack are arranged on a common carrier. Said carrier comprises in particular a substrate of the light-emitting device. The substrate forms the bottom face of the light-emitting device, for example. The substrate may be formed by a glass and/or a plastics material. In particular, the carrier can be designed to be translucent or transparent. In addition, the carrier can have a rigid or flexible design, for instance. The carrier can also comprise, for example, one or more auxiliary layers for planarization of the substrate and/or for electrical insulation of the substrate. The auxiliary layer can additionally or alternatively have a reflective or light-scattering design, for example. The auxiliary structure can comprise the auxiliary layer, for instance, i.e., the auxiliary structure can extend between the layer stacks and between the substrate and the layer stacks.

In at least one embodiment, the first layer stack and the at least one additional layer stack are arranged laterally adjacent to one another. This means in particular that, when the light-emitting device is viewed vertically from above, the respective visible segments are arranged laterally adjacent to one another. Owing to fabrication tolerances, the respective layer stacks and specifically the electrodes thereof may, for example, be stacked vertically such that parts thereof lie one above the other, i.e., are arranged in an overlapping manner. With this in mind, the auxiliary structure is designed to be an electrical insulator, for example.

In at least one embodiment, the first layer stack and the at least one additional layer stack and the electrodes thereof are arranged laterally adjacent to one another without an overlap in the vertical direction. This advantageously can contribute to efficient production of the light-emitting device. In addition, this can allow the surface of the layer stacks that faces away from the respective first electrodes to have a flat embodiment within production tolerances.

In at least one embodiment, the auxiliary structure is designed to be an electrical insulator. This allows the first layer stack and the at least one additional layer stack, and specifically the respective first electrodes, to be in a vertically overlapping arrangement. For instance, the at least one additional layer stack is arranged in a partial overlap vertically on a face of the first layer stack that faces away from the bottom face. By virtue of the auxiliary structure, which is designed to be an electrical insulator, between the layer stacks, it can be guaranteed in particular that operation of the light-emitting device, in particular with regard to an illuminable segment assigned to the first layer stack, remains largely unaffected by a first electrode assigned to the at least one additional layer stack. In other words, when current is supplied via the first electrode assigned to the at least one additional layer stack, light is generated solely in the at least one additional layer stack, irrespective of light generation in the first layer stack.

In at least one embodiment, the auxiliary structure is designed to be translucent at least in places. This advantageously allows light generated in the respective layer stacks to pass through the auxiliary structure. This can help to minimize the visible separating area between segments in each pair of laterally adjacent segments, in which area no light is generated. In this regard, for example, at least part of the at least one additional layer stack can be arranged on a face of the auxiliary structure that faces away from the carrier in the vertical direction. In this case, for instance, light generated in the at least one additional layer stack can pass in full vertically through the auxiliary structure, with the result that the laterally adjacent segments appear connected and contiguous during operation of the light-emitting device.

In at least one embodiment, the auxiliary structure has a light-scattering design, at least in places. The auxiliary structure is designed in particular to scatter at least some of the light generated in the respective layer stacks. In particular, this can achieve redistribution of light generated in the respective layer stacks and coupling-out of light captured by total internal reflection in the light-emitting device (what are known as substrate modes or glass modes). For instance, the auxiliary structure comprises one or more scattering layers in this context. In particular, the scattering layer is a translucent layer that appears opaque to a viewer.

In at least one embodiment, the auxiliary structure comprises a multiplicity of scattering particles and/or scattering centers for scattering the light. The scattering particles are preferably inorganic scattering particles, preferably made of a material such as titanium dioxide or zirconium dioxide that has a high refractive index. A mean diameter of the scattering particles lies between 10 nm and 5 μm, for example. The mean diameter of the scattering particles in particular lies between 100 nm and 1000 nm inclusive and/or between 10 nm and 100 nm inclusive. A suitable concentration of the scattering particles and/or a layer thickness of the auxiliary structure in the vertical direction can be used to adjust a brightness of the light emitted by the auxiliary structure, for example, to match a brightness of the light emitted by the respective segments. A refractive index of the auxiliary structure can also be adjusted in this regard.

In at least one embodiment, the auxiliary structure contains a matrix material, into which the scattering particles are introduced and embedded. The matrix material may be, for example, an inorganic material such as a glass, or an organic material such as a polymer. For instance, the matrix material is an epoxide, a silicone, a hybrid epoxy-silicone material, a polycarbonate or an acrylate. Alternatively or additionally, the matrix material can also contain, or be made of, metal oxides, so for instance the following substances: silicon oxide (SiO2), zinc oxide (ZnO), zirconium oxide (ZrO2), indium tin oxide (ITO), antimony tin oxide (ATO), aluminum zinc oxide layer (AZO) or indium zinc oxide (IZO), gallium oxide (Ga2Ox), aluminum oxide (Al2O3) or titanium oxide.

In at least one embodiment, the auxiliary structure is applied by a patterned process such as screen printing or inkjet printing, for instance. In this case, the auxiliary structure can be applied, for example, before applying the layer stacks and each of the first electrodes, between applications of respective adjacent layer stacks, or after applying the layer stacks, in particular according to a desired overlap of the layer stacks and the auxiliary structure in the vertical direction. Advantageously the patterned process results in only low fabrication tolerances, for instance 20 µm, and therefore the auxiliary structure can in particular offset fabrication tolerances such as those arising when applying the layer stacks, for instance. For example, the use of masks in a physical vapor deposition (PVD) process for applying the layer stacks can result in fabrication tolerances between 100 µm and 200 µm.

In at least one embodiment, the auxiliary structure is arranged in direct contact with the layer stacks in each pair of adjacent layer stacks. The light generated in the respective layer stacks can advantageously be redistributed and coupled-out efficiently and in a controlled manner, for instance on the basis of a known ratio of the associated refractive indices. This also helps to minimize a spacing of the respective layer stacks, or in other words a width of the separating area, in the lateral direction.

In at least one embodiment, the auxiliary structure completely fills a region between layer stacks of each pair of adjacent layer stacks in the lateral direction. In this case, the auxiliary structure can be arranged in particular in direct contact with the layer stacks of each pair of adjacent layer stacks. A particularly high efficiency for the redistribution and coupling-out of the light generated in the respective layer stacks can hence advantageously be achieved. Alternatively and/or additionally, completely filling the region in the lateral direction allows at least a complete overlap of the first layer stack and the auxiliary structure, and/or a complete overlap of the at least one additional layer stack and the auxiliary structure. With this in mind, the auxiliary structure is designed to be an electrical insulator, for example.

In at least one embodiment, the first layer stack and the auxiliary structure are arranged to overlap in the vertical direction. This has the advantage that light can pass vertically through at least some of the region between the layer stacks, allowing the visible separating area to be minimized. With this in mind, the auxiliary structure is designed to be translucent at least in places, for example. An overlap of this type also helps to achieve easy production of the light-emitting device, in particular with regard to fabrication tolerances. Direct contact between the auxiliary structure and layer stacks of each pair of adjacent layer stacks, and filling completely the region between the layer stacks of each pair of adjacent layer stacks, can hence be achieved particularly efficiently. In this context, it is possible, for instance, for a first electrode assigned to the first layer stack to overlap partially the auxiliary structure in the vertical direction. An overlap of this type of the first layer stack in the vertical direction can here result in particular in the first layer stack and/or the associated electrode having an inclined angle and/or surface curvature, at least in portions, with respect to the main planes of the light-emitting device. In this case, the associated first electrode is preferably continuous over the whole surface.

In at least one embodiment, the at least one additional layer stack and the auxiliary structure are arranged to overlap in the vertical direction. An overlap of this type for instance alternatively or additionally contributes to the easy production of the light-emitting device.

In at least one embodiment, the layer stacks of each pair of adjacent layer stacks are designed such that a main extension direction of the separating area between layer stacks of each pair of adjacent layer stacks and a main extension direction of the light-emitting device enclose an angle between 0° and 90°, in particular between 22.5° and 67.5°. A graphical symbol such as an arrow or a direction-indicating graphical shape of this type, for instance, is advantageously produced for the viewer of the light-emitting device looking vertically from above.

In at least one embodiment, the first layer stack comprises a recess in the lateral direction. In addition, the at least one additional layer stack extends laterally into the recess. The graphical symbol is produced for the viewer of the light-emitting device looking vertically from above advantageously in a particularly space-saving manner with regard to a light-emitting surface area of the light-emitting device.

In at least one embodiment, the light-emitting device is part of a lighting unit, or the light-emitting device is the lighting unit. The lighting unit may be a taillight of a motor vehicle or a headlamp of the motor vehicle, for example. The motor vehicle is preferably an automobile.

In at least one embodiment, the light-emitting device comprises at least two or at least four or at least six layer stacks. Alternatively or additionally, the number of layer stacks of the light-emitting device is at most 64 or 32 or 25 or 16 or 10. In other words, the light-emitting device is then not a high-resolution display having a large number of pixels.

In at least one embodiment, the light-emitting device comprises the first layer stack for generating light and one of the additional layer stacks for generating light, wherein each of the layer stacks is assigned one of the first electrodes, which makes electrical contact with the associated layer stack. In addition, the second electrode is assigned to the layer stacks and makes electrical contact with the layer stacks, so that the layer stacks can each be driven separately from one another. The auxiliary structure is arranged in the region between the layer stacks, with the auxiliary structure completely filling the region in the lateral direction. In addition, the auxiliary structure has a light-scattering design, so that the region is illuminated when light is generated in at least one of the layer stacks. In particular in this case, the auxiliary structure allows light from just one of the layer stacks or from both layer stacks, for example, to be selectively redistributed in the region. For this purpose, for example, light generated in the associated layer stack is scattered in the region, and is then emitted in particular vertically to the outside of the light-emitting device.

In at least one embodiment, the light-emitting device comprises the first layer stack for generating light and one of the additional layer stacks for generating light, wherein each of the layer stacks is assigned one of the first electrodes, which makes electrical contact with the associated layer stack. In addition, the second electrode is assigned to the layer stacks and makes electrical contact with the layer stacks, so that the layer stacks can each be driven separately from one another. The auxiliary structure is arranged in the region between the layer stacks, wherein the auxiliary structure is arranged vertically above a partial region of the first layer stack. The additional layer stack is arranged vertically above at least one partial region of the auxiliary structure. The auxiliary structure is designed to be an electrical insulator, so that operation of the first layer stack remains largely unaffected by the electrode assigned to the additional layer stack. In addition, the auxiliary structure is designed to be translucent, so that the region is illuminated when light is generated in the additional layer stack. This has the advantage that the visible separating area between the first layer stack and the additional layer stack can be minimized. Light is generated in this case solely in the additional layer stack by the supply of current via the first electrode assigned to the additional layer stack. Light generation in the first layer stack is in particular performed independently thereof.

BRIEF DESCRIPTION OF THE DRAWINGS

Further features, embodiments and advantages are given in the following description of the exemplified embodiments in conjunction with the figures, in which:

FIGS. 1a and 2a are a schematic sectional view and plan view respectively of a first exemplified embodiment of a light-emitting device having a plurality of segments that can be driven separately from one another;

FIGS. 1b and 2b are a schematic sectional view and plan view respectively of a first part of the light-emitting device according to the first exemplified embodiment;

FIGS. 1c and 2c are a schematic sectional view and plan view respectively of a second part of the light-emitting device according to the first exemplified embodiment; and FIGS. 1d and 2d are a schematic sectional view and plan view respectively of a second exemplified embodiment of a light-emitting device having a plurality of segments that can be driven separately from one another.

In the figures, the same reference numbers are used to denote identical, similar or equivalent elements. The figures and the relative sizes of the elements illustrated in the figures shall not be considered to be to scale. Indeed individual elements and in particular layer thicknesses may be shown exaggeratedly large in order to improve visualization and/or understanding.

DETAILED DESCRIPTION

A first exemplified embodiment of a light-emitting device 1 having a plurality of segments 17, 19 that can be driven separately from one another is shown schematically by FIG. 1a in a sectional view and by FIG. 2a in a plan view. As FIG. 1a shows, the light-emitting device 1 comprises a carrier 9, which extends in the lateral direction. The carrier 9 comprises in particular a substrate (not shown in greater detail). The light-emitting device 1 is for instance an organic layer stack having an active region designed to generate light (not shown explicitly in the figures to simplify diagram).

In this exemplified embodiment, the carrier 9 is designed to be translucent, i.e., comprises, for example, at least one layer made of glass, so that light can pass through the carrier during operation of the light-emitting device 1. In this regard, the light-emitting device 1 can have an emission direction pointing vertically towards a bottom face of the light-emitting device 1 (known as a "bottom emitter").

On a face of the carrier 9 that faces away from bottom face of the light-emitting device 1 are arranged laterally adjacent to one another a first layer stack 3 for generating light and additional layer stack 5 for generating light. The layer stacks 3, 5 comprise, for example, organic semiconductor material, in particular organic layers for emitting light and for supplying charge carriers. In this exemplified embodiment, the material and thickness of the layer stacks 3, 5 in the vertical direction are designed to be identical, for example. In other exemplified embodiments, the material and thickness of the layer stacks 3, 5 may differ from one another, in particular with regard to characteristics of the light to be emitted, for instance a characteristic such as a color.

Each of the layer stacks 3, 5 is assigned a first electrode 11, 13, which is arranged between the layer stacks 3, 5 and the carrier 9. The first electrodes 11, 13 each comprise, for example, a conductive oxide, metal or metal oxide such as indium oxide, for instance. The first electrodes 11, 13 can have a transparent design, for example, in this context. The first electrodes 11, 13 are arranged laterally adjacent to one another, for instance. In this exemplified embodiment, viewed vertically from above, the first electrodes 11, 13 are arranged in particular congruent with the layer stacks 3, 5.

A region laterally between the layer stacks 3, 5 and/or between the respective electrodes 11, 13 is filled over its entire surface by an auxiliary structure 7. The auxiliary structure 7 is preferably made of, or contains, a polyamide, acrylate or epoxide. In this case, the auxiliary structure 7 is designed to be translucent at least in places, for example. In particular, the auxiliary structure 7 has a light-scattering design, so that a light generated in the layer stacks 3, 5 and emitted into the auxiliary structure 7 is scattered by the auxiliary structure 7 such that the light is redistributed. The auxiliary structure 7 can be designed in this respect to couple out glass modes, for example. In other words, light generated in the layer stacks 3, 5 is emitted by the auxiliary structure 7 vertically towards a region outside the light-emitting device 1. For this purpose, the auxiliary structure 7 comprises, for example, a multiplicity of scattering particles and/or scattering centers for scattering the light. A refractive index of said auxiliary structure 7 is in particular greater than a refractive index of the carrier 9. In particular, an emission direction of the auxiliary structure 7 is substantially the same as the emission direction of the light-emitting device 1.

The layer stacks 3, 5 are also assigned a common second electrode 15, which is arranged on a face of the layer stacks 3, 5 that faces away from the bottom face of the light-emitting device 1 in the vertical direction. The second electrode 15 contains in particular a conductive material having a high reflectivity, for instance a material such as aluminum. In this exemplified embodiment, viewed vertically from above, the second electrode 15 is arranged in particular such that the layer stacks 3, 5 are completely covered.

The first electrodes 11, 13 form, for example, anodes of the segments 17, 19, and the second electrode 15 forms a cathode of the segments 17, 19. By contact being made separately with the respective first electrodes 11, 13 and with the second electrode 15, the segments 17, 19 can generate light separately from one another during operation of the light-emitting device 1. Coupling-out light generated in the layer stacks 3, 5 through the auxiliary structure 7 means that the region between the layer stacks 3, 5 that is filled laterally by the auxiliary structure 7 is barely perceptible to a viewer as a visible separating area between the segments 17, 19. In fact, when only the first layer stack 3 is generating light, the first segment 17 can appear to be enlarged laterally by the auxiliary structure 7. Likewise, when only the additional layer stack 5 is generating light, the additional segment 19 can appear to be enlarged laterally by the auxiliary structure 7. In particular when both layer stacks 3, 5 are generating light, the separating area between the segments 17, 19 is discernible, for example, only by a blurred coupling-out of light from both layer stacks 3, 5.

The plan view corresponding to FIG. 1a and shown schematically in FIG. 2a shows the light-emitting device 1 in a condition in which no light is being generated in the layer stacks 3, 5. The layer stacks 3, 5, or respectively the segments 17, 19, are shaped like an arrow in the lateral direction. The additional layer stack 5 in particular comprises a lateral recess into which the first layer stack 3 extends. The auxiliary structure 7 arranged in the region laterally between the layer stacks 3, 5 is discernible in this condition of the light-emitting device 1 as an opaque separating area, for example.

FIG. 1b shows a schematic sectional view of a first part of the light-emitting device 1 according to the first exemplified embodiment. The first part of the light-emitting device 1 here comprises only the carrier 9 and the auxiliary structure 7. For instance this may be the case during production of the light-emitting device 1 when initially only the auxiliary structure 7 is applied to the carrier 9. For this purpose, the auxiliary structure 7 is applied using an inkjet or screen-printing process, for example.

Corresponding to this figure, FIG. 2b shows a plan view of the first part of the light-emitting device 1. The auxiliary structure 7 is shaped here such that the lateral region between the layer stacks 3, 5 is completely filled. The shape of said auxiliary structure 7 can differ from the shape shown in FIG. 2b, for instance in the case in which the layer stacks 3, 5 and the auxiliary structure 7 are designed to overlap in the vertical direction.

FIGS. 1c and 2c each show a second part of the light-emitting device 1 according to the first exemplified embodiment. In particular, the light-emitting device 1 is shown here without the auxiliary structure 7. During operation of only the second part of the light-emitting device 1, the separating area between the layer stacks 3, 5 is visible to a viewer as an un-illuminated area.

FIG. 1d is used to show schematically a sectional view of a second exemplified embodiment of the light-emitting device 1 having segments 17, 19 that can be driven separately from one another. As in the first exemplified embodiment, the light-emitting device 1 comprises the carrier 9, on the face of which that faces away from the bottom face of the light-emitting device 1 are arranged the first layer stack 3 and the additional layer stack 5. Each of the layer stacks 3, 5 is assigned a first electrode 11, 13, which is arranged in a vertical direction between the layer stacks 3, 5 and the carrier 9 in direct contact with, and in particular congruent with, the respective layer stacks 3, 5.

A region between the layer stacks 3, 5 and/or between the respective electrodes 11, 13, is filled completely by the auxiliary structure 7, i.e., in particular in the lateral and vertical directions. In this case, the auxiliary structure 7 overlaps in particular the first layer stack 3 in the vertical direction. A surface of the first layer stack 3 that faces away from the bottom face of the light-emitting device 1 thus includes material of the auxiliary structure 7. The additional layer stack 5 and the first electrode 13 assigned to the additional layer stack 5 overlap the auxiliary structure 7 and the first layer stack 3 in the vertical direction. A surface of the auxiliary structure 7 that faces away from the bottom face of the light-emitting device 1, in particular the part of the auxiliary structure 7 that overlaps the first layer stack 3 in the vertical direction, thus includes material of the additional layer stack 5 and/or of the electrode 13 assigned to the additional layer stack 5.

In this case, the auxiliary structure 7 is designed to be translucent at least in places, for example. In particular, the auxiliary structure 7 is designed to be an electrical insulator, so that operation of the first layer stack 3 remains largely unaffected when current is supplied via the electrode 13 assigned to the additional layer stack 5. For example, a light generated in the additional layer stack 5 passes through the auxiliary structure 7 vertically such that the region between the layer stacks 3, 5 is barely perceptible to a viewer as a visible separating area between the segments 17, 19. The auxiliary structure 7 can here optionally have a light-scattering design, similar to the first exemplified embodiment, so that light generated additionally by the first layer stack 3, for example, can be redistributed and emitted by the auxiliary structure 7.

The layer stacks 3, 5 are also assigned the common second electrode 15, which is arranged on a face of the layer stacks 3, 5 that faces away from the bottom face of the light-emitting device 1 in the vertical direction.

By contact being made separately with the respective first electrodes 11, 13 and with the second electrode 15, the segments 17, 19 can generate light separately from one another during operation of the light-emitting device 1. By virtue of the auxiliary structure 7, the region between the layer stacks 3, 5 that is filled laterally by the auxiliary structure 7 is barely perceptible to a viewer as a visible separating area between the segments 17, 19 at least as a result of light generated in the additional layer stack 5 passing through the auxiliary structure 7. When only the first layer stack 3 is generating light, the first segment 17 can appear to be delimited to a lateral extent of the layer stack 3. When only the additional layer stack 5 is generating light, the additional segment 19 can appear to be enlarged laterally by the auxiliary structure 7. An identical effect likewise occurs when both layer stacks 3, 5 are generating light.

The plan view of the light-emitting device 1 shown schematically in FIG. 2d shows the light-emitting device 1 according to the first exemplified embodiment and the second exemplified embodiment in a condition in which light is being generated at least in one of the layer stacks 3, 5. In the region laterally between the layer stacks 3, 5, light is emitted vertically towards the region outside the light-emitting device 1, with the result that the auxiliary structure 7 arranged there and the separating area are not visible to the viewer.

The description referring to the exemplified embodiments does not limit the invention. Instead, the invention includes every novel feature and every combination of features, which in particular includes every combination of features in the claims, even if this feature or combination is not itself explicitly mentioned in the claims or exemplified embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. A light-emitting device comprising:
a first layer stack configured to generate light;

at least one additional layer stack configured to generate light, wherein each of the first layer stack and the at least one additional layer stack are separately drivable from one another; and an auxiliary structure arranged between the first layer stack and the at least one additional layer stack, wherein the auxiliary structure is electrically insulating, a first electrode is assigned to each of the first and the at least one additional layer stacks, each of the first electrodes makes electrical contact with its assigned layer stack, the auxiliary structure is arranged between the first layer stack and the at least one additional layer stack along a lateral direction, wherein each of the at least one additional layer stack and the first layer stack is part of a segment of the light-emitting device, and at least two of the segments, of which each of the at least one additional layer stack and the first layer stack are a part, differ in a color of light produced in the respective segments.

2. The light-emitting device according to claim 1, wherein at least one of the first electrodes is in direct contact with the auxiliary structure.

3. The light-emitting device according to claim 1, wherein each of the first electrodes is in direct contact with the auxiliary structure.

4. The light-emitting device according to claim 1, wherein each of the first electrodes comprises a transparent conductive oxide.

5. The light-emitting device according to claim 1, wherein each of the first electrodes is arranged in direct contact with the associated layer stack on a surface of the associated layer stack.

6. The light-emitting device according to claim 1, further comprising a second electrode assigned to the first and the at least one additional layer stacks, each of the second electrodes makes electrical contact with the associated layer stack.

7. The light-emitting device according to claim 1, wherein the first layer stack and the at least one additional layer stack are configured to generate light independently from each other.

8. The light-emitting device according to claim 1, wherein the first layer stack and the at least one additional layer stack are arranged on a common carrier.

9. The light-emitting device according to claim 1, wherein the auxiliary structure fills a region in a lateral direction between the first layer stack and the at least one additional layer stack.

10. The light-emitting device according to claim 1, wherein the auxiliary structure is reflective or light-scattering.

11. A light-emitting device comprising:

a first layer stack configured to generate light;

at least one additional layer stack configured to generate light, wherein each of the first layer stack and the at least one additional layer stack are separately drivable from one another; and an auxiliary structure arranged between the first layer stack and the at least one additional layer stack, wherein the auxiliary structure is electrically insulating, a first electrode is assigned to each of the first and the at least one additional layer stacks, each of the first electrodes makes electrical contact with the associated layer stack, the auxiliary structure is arranged between the first layer stack and the at least one additional layer stack along a lateral direction, wherein the first layer stack and the at least one additional layer stack comprise at least one different material.

12. The light-emitting device according to claim 1, wherein the first layer stack and the at least one additional layer stack differ in thickness.

13. A light-emitting device comprising:

a first layer stack configured to generate light;

at least one additional layer stack configured to generate light, wherein each of the first layer stack and the at least one additional layer stack are separately drivable from one another; and an auxiliary structure arranged between the first layer stack and the at least one additional layer stack, wherein the auxiliary structure is electrically insulating, a first electrode is assigned to each of the first and the at least one additional layer stacks, each of the first electrodes makes electrical contact with the associated layer stack, the auxiliary structure is arranged between the first layer stack and the at least one additional layer stack along a lateral direction, wherein the auxiliary structure is in direct contact with the first layer stack and the at least one additional layer stack in a region along the lateral direction between the first layer stack and the at least one additional layer stack.

14. The light-emitting device according to claim 1, wherein, during operation, a gap between the first layer stack and the at least one additional layer stack is not visible.

15. The light-emitting device according to claim 1, wherein each of the first electrodes is congruent with the associated layer stack.

16. The light-emitting device according to claim 11, wherein each of the at least one additional layer stack and the first layer stack is part of a segment of the light-emitting device.

17. The light-emitting device according to claim 16, wherein at least two of the segments of which each of the at least one additional layer stack and the first layer stack are a part differ in a color of light produced in the respective segments.

18. The light-emitting device according to claim 1, wherein at least two of the segments of which each of the at least one additional layer stack and the first layer stack are a part differ in their shape.

19. The light-emitting device according to claim 1, wherein at least two of the segments of which each of the at least one additional layer stack and the first layer stack are a part differ in their lateral extent.

20. The light-emitting device according to claim 1, wherein at least two of the segments of which each of the at least one additional layer stack and the first layer stack are a part differ in a brightness of light produced in the respective segments.

* * * * *